June 10, 1969 WOO F. CHOW 3,449,731

PLATED WIRE MEMORY PLANE

Filed July 30, 1965

INVENTOR
WOO F. CHOW

BY Rene A. Kuypers

ATTORNEY

United States Patent Office 3,449,731
Patented June 10, 1969

3,449,731

PLATED WIRE MEMORY PLANE

Woo F. Chow, Horsham, Pa., assignor to Sperry Rand Corporation, New York, N.Y., a corporation of Delaware Filed July 30, 1965, Ser. No. 475,941
Int. Cl. G11b *5/00*
U.S. Cl. 340—174 7 Claims

ABSTRACT OF THE DISCLOSURE

This invention relates to be plated wire memory plane which provides a low impedance transfer loop. The plane is formed by forming the wire into a co-axial structure by insulating the wire from the supporting metal substrate with the oxide of the metal. The ends of the wire are connected to a metal of low resistivity such as a copper substrate to provide a low impedance wire transfer loop wherein information can be transferred from one location to another location along its length.

This invention relates in general to a memory plane and in particular relates to a low impedance memory plane for use with a plated wire memory element.

In certain memory applications employing plated wires, it is necessary that a bit located along the wire generates a relatively high power pulse (i.e., a relatively high voltage signal at a low impedance). A plated wire must generate a high power pulse when, for example, a bit or current steering technique is utilized. In accordance with this technique, the information stored in a first bit location along the plated wire is transferred to a second bit location. This is accomplished by having a first bit location generate a pulse of sufficient power during a memory read cycle to transfer the information stored therein to a second bit location. This can only be accomplished if the voltage induced by a memory readout of the first location along the plated wire sees a low impedance so that a steering current is generated which is relatively high. Presently known memory planes have an impedance characteristic several orders of magnitude too large.

Accordingly, it is an object of this invention to provide a new and improved memory plane arrangement.

It is still another object of this invention to provide a new and improved memory plane arrangement for use with a plated wire storage element.

It is yet another object of this invention to provide a memory plane arrangement which is characterized by a relatively low impedance.

In accordance with a feature of this invention, a memory plane for use with a plated wire storage element is provided which is characterized by a word loop characteristic impedance of only a few ohms. This low impedance structure is obtained in one embodiment by providing a very thin layer of insulation on a metal substrate. The thin layer of insulation may comprise a uniformly controlled layer of aluminum oxide on an aluminum substrate. The plated wires are then positioned in grooves formed in the memory plane thereby providing a low impedance co-axial structure.

In accordance with another feature of this invention, a memory plane as above described is utilized in conjunction with a cover arrangement which also comprises a thin layer of aluminum oxide on an aluminum substrate. The cover is grooved in alignment with the plated wires positioned in the above-mentioned grooved memory plane. However, a portion of the aluminum including the aluminum oxide is removed from the grooves of the cover so that a path to the plated wires is provided for a magnetic field generated by orthogonally positioned drive lines. In this embodiment, the plated wire is almost completely surrounded by a metallic outer conductor separated by a thin layer of insulation so that it substantially approximates a co-axial line.

The novel features that are considered characteristic of this invention are set forth with particularity in the appended claims. The invention itself, however, both to its organization and method of operation, as well as additional objects and advantages thereof, will best be understood from the following description when considered in conjunction with the accompanied drawing, wherein:

Figure 1:
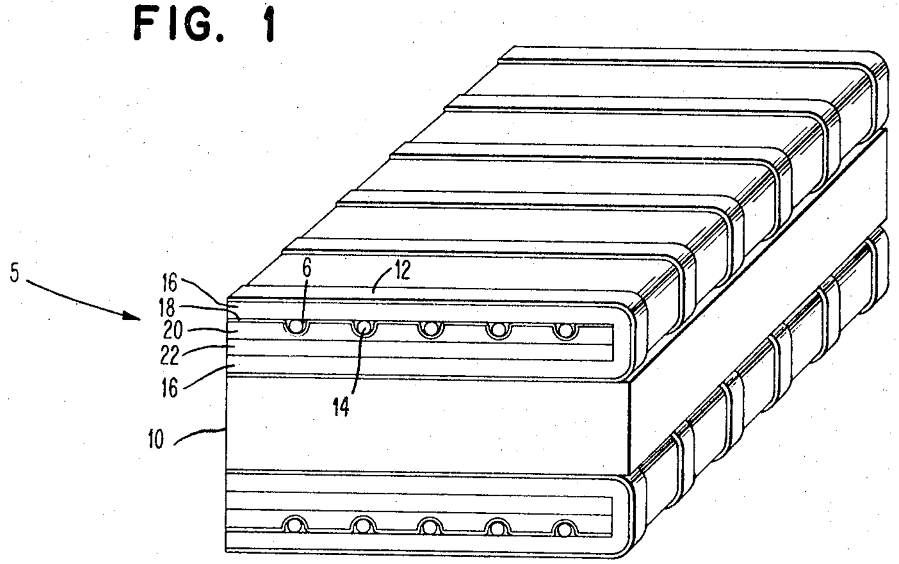
FIGURE 1 depicts a memory plane for use with a plated wire storage element.

Referring now to FIGURE 1, the memory plane 5 in accorance with this invention is formed on either side of a rigid dielectric material 10. The dielectric material 10 may be fabricated from any well known material and is utilized primarily as a support for the memory plane 5. The memory plane 5 is formed into a plurality of co-axial lines by first forming grooves 6 in a metallic substrate material 20 such as aluminum, which is approximately one-half mil thick. The grooves 6 are obtained by mechanical or electrical expedients well known in the art. After the grooves 6 have been formed, an insulting aluminum oxide surface 18 is formed on the upper surface thereof by anodizing the aluminum. The aluminum oxide insulation 18 is formed in a controlled manner to a thickness on the order of 1–2 microns. A micron is defined as $10^{-6}$ meters. After the aluminum oxide insulating surface 18 is formed on the aluminum substrate 20, a thin copper layer 22 approximately 4–5 mils thick is deposited on the back side of the aluminum substrate for reasons that will be discussed in a later paragraph. It should be noted that the grooves 6 may be formed after the insulating oxide surface has been applied to the aluminum substrate 20.

The grooves 6 in the aluminum substrate 20 are adapted to receive magnetic thin film plated wires 14 and hence are only slightly larger in diameter. The plated wires 14 are typically 5 mil diameter beryllium copper substrates upon whose surface is formed a thin, magnetic film. The thin, magnetic film is electroplated on the wire surface with approximately a 10,000 angstrom thickness of permalloy (80% nickel-20% iron). The permalloy coating is electroplated in the presence of a circumferential magnetic field that establishes a uniaxial anisotropy axis at right angles i.e., around the circumference) to the length of the wire. The uniaxial anisotropy establishes an easy and hard direction of magnetization and the magnetization vectors of the thin film are normally oriented in a first or second equilibrium position along the easy axis, thereby establishing two bistable states necessary for binary logic application. One end of each of the plated wires 14 is connected to the copper layer 22. The other end of the plated wires 14 are connected to a sense amplifier (not shown) with a very low input impedance and to a bit driver (not shown) through appropriate matrix selection circuitry. In another embodiment, both ends of the plated wires 14 are connected to the copper layer. In another embodiment, one end of each of the plated wires 14 is connected to the copper layer 22. The other ends of 14 are connected to the copper layer 22 via a capacitor. In another embodiment, one end of each of the plated wires 14 are connected to the copper layer 22. The other end of 14 are connected to the copper layer 22 via a resistor which has the characteristic resistance of the transmission line consisting of wire 6 and the aluminum substrate 20. It should be noted that the grooves or slots may be designed so that the plated wires are completely or only partially embedded therein.

Positioned around the aluminum substrate including the copper layer 22 is a plastic substrate 16. The plastic substrate 16 may be of Mylar composition or other plastics on the surface of which is etched a plurality of equally spaced metal conductors or drive straps 12. The drive straps 12 are arranged so that one leg of the drive straps extends along the upper side of the plated wires 14 and the other leg extends along the under side of the same plated wires. In a typical embodiment, the drive straps 12 are 20 mils wide and are placed on 40 mil centers. The Mylar material 16 is approximately 1 mil thick. The drive straps 12 are oriented substantially orthogonal to the plated wires 14 as is customary in a plated wire memory arrangement. The intersection of a drive strap 12 and a plated wire 14 comprises a memory bit position which is adapted to store a binary "0" or "1" depending upon the orientation of the magnetization vectors around the easy axis. Thus, when the drive straps 12 are energized by an appropriate drive current via a driving circuit (not shown), a magnetic field is generated which acts upon the magnetized coating of the plated wire. By this means, information is adapted to be readout of or written into a certain bit position along the plated wire 14.

As discussed above, it is necessary that the plated wires 14 have a low impedance loop characteristic so that the technique of bit or current-steering, for example, may be accomplished. This technique is more fully described in the co-pending patent application of Woo F. Chow, Serial Number 466,904 filed June 25, 1965. Since the aluminum substrate 20 has a relatively high resistance, the copper layer 22, which has a low resistance, is formed on the under surface of the aluminum. The plated wires 14 are therefore connected to the copper in order that their loop resistance be kept low. The plated wires 14 are further characterized by a low impedance since the grooves 6 which receive the plated wires 14 include a very thin layer of insulation and hence approximates a co-axial line. The impedance of a co-axial line can be shown to be a function of the thickness of the insulating layer separating two concentric conductors. The inner conductor in the present embodiment is the plated wire 14 and outer conductor is the aluminum substrate 20 and the insulator is the aluminum oxide 18. Since in accordance with this invention, the aluminum oxide layer 18 can be controlled very accurately and to a very thin dimension (1–2 microns or less), it can be shown mathematically that a very low impedance structure is obtained thereby.

The following formula mathematically shows that the impedance of a co-axial line is a function of the thickness of the insulation separating two conductors.

$$Z_o=\frac{138 \text{ Log } 10\frac{c}{b}}{\sqrt{\epsilon}}$$

where $\epsilon$=dielectric constant of the insulating material
$b$=smaller conductor radius
$c$=larger conductor radius In other words, as the ratio of $c$ to $b$ approaches 1 the insulation becomes thinner. Therefore, as the logarithm of $c/b$ approaches 0, $Z_0$ becomes very small.

The co-axial memory plane bonded to the upper surface of the dielectric support material 10 is duplicated on the under side of the dielectric support and therefore will not be further described.

It should be noted that copper layer 22, aluminum layer 20, and the drive strap 12 provide the desired strap field which is effective upon the plated film 14. In this arrangement, the transient strap field (i.e., the field produced by the rise and fall of the drive pulse or $d\phi/dt$) is provided by the current in the strap in conjunction with the image current induced in the conductive layer 22. The D.C. component of the strap current (i.e., that portion of the pulse which has a constant voltage) is confined to the strap 12. This combination has the desired effect of confining the total strap field to within a designed area and thus, reduces the adjacent bit disturbance. Normally in thick ground planes, the image current is induced at an equal distance from the bottom of the plated wire as the drive strap is above the same bottom reference point. In the instant invention, the thickness of the copper layer 22 is purposely made thin so that the transient image current induced in the copper layer is brought closer to the underside of the plated wires 14. Hence, only the film within a designated area will be switched.

Figure 2:
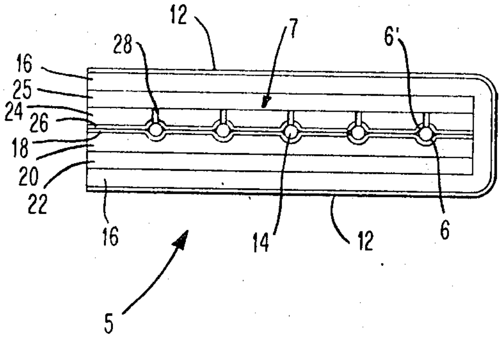
FIGURE 2 depicts a memory plane which utilizes a cover arrangement.

FIGURE 2 depicts another embodiment of a memory plane provided by this invention. Thus, the aluminum substrate 20 together with the aluminum oxide insulating coating 18 including the copper layer 22 is exactly the same as the memory plane 5 described in detail in FIGURE 1 and in addition to which a cover 7 is provided. The cover 7 comprises an aluminum substrate 24 positioned on an insulating backing 25. The backing 25 may be made, for example, of Mylar, epoxy resin or other plastics. Upon the surface of the aluminum substrate 24 is formed an aluminum oxide insulating film 26. The aluminum oxide film 26 is very thin and is controlled to the same thickness (1–2 microns) as is the memory plane 5 of FIGURE 1.

Accurately spaced grooves or slots 6' of the same dimensions as the slots 6 in the memory plane 5 of FIGURE 1 are formed so that they are in alignment with each other. The slots 6' in the cover 7 however are formed so that a small amount of aluminum including aluminum oxide are removed so as to leave a small opening 28. The reason for this opening 28 will be discussed in greater detail hereinafter.

After the cover 7 has been positioned in place, the drive straps 12, which are printed on a Mylar backing 16, are bonded both to the insulation 25 and to the copper layer 22 so that they are positioned substantially orthogonal to the plated wires 14. As in the embodiment of FIGURE 1, the intersection of a drive strap 12 with a plated wire 14 represents a memory bit position which is adapted to store either a binary "0" or a binary "1." In order however to readout or write-in new information at the various bit positions by energizing a certain drive strap 12, the flux generated thereby must be capable of surrounding the plated wire 14. The opening 28 in the upper covering permits the magnetic flux to penetrate the cover 7 so as to be able to perform read and write operations upon the plated wires 14.

It should be noted that the embodiment of FIGURE 2 approximates more exactly the co-axial line since the inner conductor (the plated wire 14) is almost completely surrounded by an outer conductor (the aluminum substrate 20 and 24). Furthermore, the aluminum oxide coating 26 is very thin between the inner and outer conductors and hence, the impedance of the plated wire is very low in accordance with the above discussed formula. In view of the fact that the impedance of the plated wire 14 is extremely low, current steering can be readily accomplished so that information may be transferred from one location on the wire to a second location on the same wire. While the instant invention has been described with respect to the forming of a thin layer of aluminum oxide on an aluminum surface, it should be realized that other techniques are available to fabricate a thin, controlled layer of insulation. Thus, a dielectric such as a crystallized and stretched polycarbonate film with a thickness of 1–2 microns may be substituted for the aluminum oxide and in that case the aluminum layer is not needed.

In summary, this invention relates to a memory plane which provides a low impedance structure for a plated wire memory element. The memory plane is arranged so as to approximate a co-axial line by fabricating a very thin layer of insulation to a controlled amount on a grooved metal substrate. Since the insulation separating the two conductors (i.e., the plated wire and the grooved metal substrate) can be controlled very accurately to a thin dimension during fabrication, a co-axial structure can be readily approximated.

A further refinement is possible in the memory plane of this invention by providing a grooved cover which comprises an insulating layer of aluminum oxide on an aluminum substrate. An opening is provided in the cover to allow a magnetic field to penetrate to the plated wires which are positioned in the grooves. In this particular embodiment, the plated wire has a conductor positioned around approximately its entire perimeter.

Obviously many modifications and variations of the present invention are possible in the light of the above teachings. It is therefore to be understood that within the scope of the appended claims, the invention may be practiced otherwise than specifically described.

The embodiments of the invention in which an exclusive property or privilege is claimed are defined as follows:

1. A coaxial structure comprising:
(a) a first metal substrate having first and second large surface, said first large surface having at least one groove formed therein, said first metal having a relatively high resistivity;
(b) a layer of insulation positioned upon said first large surface of said metal substrate including said groove;
(c) a second metal substrate having a low resistivity attached to said second large surface of said first metal substrate;
(d) a plated magnetizable wire positioned in said groove, at least one end of said plated wire being connected to said second metal substrate.

2. A memory plane comprising:
(a) a first metal substrate having first and second large surface, said first large surface having at least one groove formed therein, said first metal having a relatively high resistivity;
(b) an insulating coating formed upon said first large surface of said metal substrate including said groove wherein said insulation comprises a thin oxide layer of said first metal;
(c) a second metal substrate positioned upon said second large surface of said first metal substrate, said second metal having a low resistivity;
(d) a plated magnetizable wire positioned in said groove and at least one of the end points of said plated wire adapted to be connected to said second metal substrate;
(e) at least one conductive element surrounding said plated wire including said substrates, said element being oriented in juxtaposition and orthogonal to said plated wire.

3. A coaxial structure comprising:
(a) an aluminum substrate having first and second large surfaces, said first large surface having at least one groove formed therein;
(b) an aluminum oxide coating position upon said first large surface including said groove;
(c) a copper substrate positioned upon said second large surface of said aluminum substrate;
(d) a plated magnetizable wire positioned in said groove, at least one end of said plated wire being connected to said copper substrate.

4. A coaxial element comprising:
(a) a first metal substrate having first and second large surfaces, said first large surface having at least one groove formed therein, the resistivity of said metal substrate being relatively high;
(b) a first layer of insulation positioned upon said first large surface of said metal substrate including said groove;
(c) a second metal substrate having a low resistivity attached to said second large surface of said metal substrate;
(d) a plated magnetizable wire positioned in said groove and at least one of the end points of said plated wire adapted to be connected to said second metal substrate;
(e) a third metal substrate having first and second large surfaces, said first large surface having at least one groove formed therein, said third metal substrate being located over said first metal substrate so that said grooves are in alignment;
(f) a second layer of insulation positioned upon said first large surface of said second metal surface including said groove, said first and second layers of insulation being of the same composition and thickness;
(g) an opening being formed at said groove through said third metal substrate and said second layer of insulation.

5. A coaxial element comprising:
(a) a first aluminum substrate having first and second large surfaces, said first large surface having at least one groove formed therein;
(b) an aluminum oxide coating formed upon said first large surface including said groove;
(c) a copper substrate positioned upon said second large surface of said first aluminum substrate;
(d) a plated magnetizable wire having the property of uniaxial anisotropy, said plated wire being positioned in said groove and at least one of the end points of said plated wire adapted to be connected to said copper substrate;
(e) a second aluminum substrate having first and second large surfaces, said first large surface having at least one groove formed therein, said second aluminum substrate being positioned over said first aluminum substrate so that said grooves are in alignment;
(f) an aluminum coating formed upon said first large surface of said second aluminum substrate including said groove;
(g) an opening being formed at said groove through said third metal substrate and said second layer of insulation.

6. A memory plane comprising:
(a) a first metal substrate having first and second large surfaces, said first large surface having at least one groove formed therein;
(b) an insulating coating positioned upon said first large surface of said first metal substrate including said groove;
(c) a second metal substrate having a low resistivity positioned upon said second large surface of said first metal substrate;
(d) a plated magnetizable wire positioned in said groove and at least one of the end points of said plated wire adapted to be connected to said second metal substrate;
(e) a third metal substrate having first and second large surfaces, said first large surface having at least one groove, formed therein, said third metal substrate positioned over said first metal substrate so that said grooves are in alignment;
(f) a second insulating coating positioned upon said first large surface of said third metal substrate including said groove;

(g) a third insulating substrate positioned upon said second large surface of said third metal substrate;

(h) an opening formed in said third metal substrate and said second insulating coating up to said third insulating coating;

(i) a conductive line surrounding said plated wire including said substrate, said line being oriented in juxtaposition and orthogonal to said plated wire.

7. The memory plane in accordance with claim 1 wherein both ends of said wire are connected to said second substrate.

References Cited

UNITED STATES PATENTS

| | | | |
|---|---|---|---|
| 3,371,326 | 2/1968 | Fedde | 340—174 |
| 3,213,430 | 10/1965 | Oshima et al. | 340—174 |
| 3,175,200 | 3/1965 | Hoffman et al. | 340—174 |

JAMES W. MOFFITT, *Primary Examiner.*